United States Patent [19]

Accatino et al.

[11] Patent Number: 4,652,836
[45] Date of Patent: Mar. 24, 1987

[54] INTEGRATED MICROWAVE OSCILLATOR WITH MICROSTRIP RESONATOR FREQUENCY STABILIZER

[75] Inventors: Luciano Accatino, Turin; Giorgio Bertin, Etroubles, both of Italy

[73] Assignee: Cselt—Centro Studi e Laboratori Telecomunicazioni S.p.A., Turin, Italy

[21] Appl. No.: 831,466

[22] Filed: Feb. 19, 1986

[30] Foreign Application Priority Data

Mar. 22, 1985 [IT] Italy .............................. 67277 A/85

[51] Int. Cl.⁴ ............................................. H03B 5/18
[52] U.S. Cl. .................................. 331/96; 331/117 D
[58] Field of Search ............................. 331/96, 117 D

[56] References Cited

U.S. PATENT DOCUMENTS 4,435,688  3/1984  Shinkawa et al. ......... 331/117 D X
4,484,156  11/1984  Khanna et al. ............ 331/117 D X Primary Examiner—Eugene R. LaRoche
Assistant Examiner—David Mis
Attorney, Agent, or Firm—Karl F. Ross; Herbert Dubno

[57] ABSTRACT

An integrated microwave oscillator as which the generated frequency is stabilized by a dielectric resonator with high quality factor and stability. The positive feedback is assured not only by the dielectric resonator coupled to a line connected to a terminal of the active device, but also by a microstrip resonator connected in parallel to a second line connected to a second terminal of the active device. The signal generated is extracted from the third terminal of the active device.

2 Claims, 1 Drawing Figure

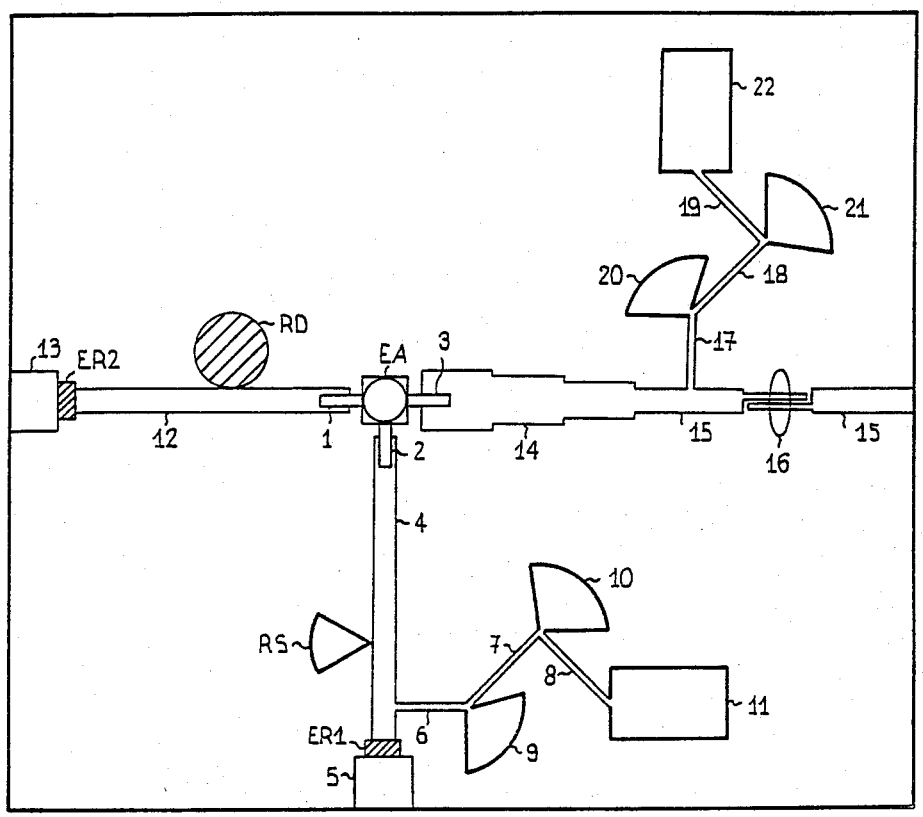

INTEGRATED MICROWAVE OSCILLATOR WITH MICROSTRIP RESONATOR FREQUENCY STABILIZER

The present invention relates to apparatus for microwave telecommunications systems and, more particularly to an integrated microwave oscillator.

BACKGROUND OF THE INVENTION

As known, one of the requirements for microwave oscillators is a frequency stability irregardless of temperature or other circuit parameter variations, for example, a supply voltage variation. The most important perturbations are caused by temperature variations of the active device, generally consisting of a junction transfer or of an FET.

Such variations cause a considerable variation of electric parameters ($\beta$ or $\mu$), which cannot be directly compensated for, hence a stabilizing element outside the device is necessary.

A widely-used method uses a high-stability resonator with high quality factor (Q) placed at a suitable circuit point.

As is known, the oscillation frequency is determined by zero reactance conditions in the circuit under working conditions and near the resonance frequency of the resonator; reactance variations of the active device due to temperature variations are compensated for by reactance variations of the high-Q element, originated by a low frequency-shift. In fact, this type of resonator yields considerable reactance variations in the vicinity of the resonance frequency, allowing zero reactance conditions to be gained again.

Nowadays the resonant high Q element generally consists of a dielectric resonator. An application of such an element is shown, e.g. in U.S. Pat. No. 4,149,127. There a dielectric resonator stabilized FET microstrip oscillator is described, the resonator being placed on the gate line. The feedback for starting the oscillations is obtained by a suitable-length line trunk connected to the source and terminated by a short circuit.

This circuit can supply a highly stable oscillation frequency, but may be insufficiently protected against the danger of parasitic oscillations chiefly at low frequencies, since the impedance viewed from the source is a pure reactance. To overcome this inconvenient, a resistive component ought to be introduced which intervenes only outside the operating frequency band, thus reducing the whole circuit gain and hence the degree of positive feedback.

A recent embodiment of a microwave oscillator, described in the paper entitled "Efficient low-noise three port X-band FET oscillator using two dielectric resonators", Proceedings of International Microwave Symposium—1982—Dallas (Tex.), realizes this condition by using a second resonating element, identical to the stabilizing element. This is placed along a line outgoing from FET source, which is no longer short-circuited, but is terminated by a 50 ohm adapted resistive load. The resonating element coupled to the source line operates as a parallel-type resonator placed in series and hence at resonance the line becomes an open circuit. By suitably positioning the resonator, the desired reactance can be obtained at the source.

Far from resonance the resonator behaves as a short circuit, that is why the line results terminated into its characteristic impedance and a pure resistive load is obtained at the source. As a consequence parasitic oscillations are rare.

However such a circuit presents two disadvantages. Firstly, the resonator placed along the source line realizes at the resonance an imperfect open-circuit, as a non-negligible resistive component remains even for high coupling values. This results in a lower degree of positive feedback and hence in lower output power.

Secondly, the presence of two high-Q and hence highly-limited-band resonators renders the oscillator adjustment very critical. In fact the oscillation condition takes place only when the two resonators are nearly exactly synchronous, while a small resonator displacement in the direction perpendicular to the line is sufficient to modify its resonance frequency.

OBJECT OF THE INVENTION

It is the object to overcome these disadvantages with the integrated microwave oscillator provided by the present invention, which generates a frequency-stabilized signal by eliminating parasitic oscillations outside the operating band, which supplies a good output power level owing to the high degree of positive feedback and which is easy to adjust.

SUMMARY OF THE INVENTION

The present invention provides an integrated microwave oscillator, wherein the first terminal of an active device is connected to a first line, grounded by a resistive element having a value equal to its characteristic impedance, a dielectric resonator being coupled to said first line at a suitable distance from the first terminal, the second terminal of the active device is connected to a second line grounded by a resistive element of value equal to its characteristic impedance and a third terminal of the active device is connected to the output through an impedance matching line, filtering networks for the passage of feeding and bias currents being connected to said terminals. According to the invention in parallel with the second line there is placed a microstrip resonator with a quality factor considerably lower than the quality factor of said dielectric resonator and with a resonance frequency close to that of the dielectric resonator, the microstrip resonator location along the second line being chosen such as to obtain the desired impedance at the second terminal.

BRIEF DESCRIPTION OF THE DRAWING

The foregoing and other characteristics of the present invention will be made clearer by the following decription of a preferred embodiment thereof, given by way of example and not in a limiting sense, with reference to the accompanying drawing the sole FIGURE of which is a diagrammatic top view of the chip whereupon the integrated oscillator is made.

SPECIFIC DESCRIPTION

In the drawing EA denotes the active device consisting e.g. of an FET with gate 1, source 2 and a drain 3, respectively. Source 2 is connected to a line 4 terminated in its characteristic impedance by a resistive element ER1, grounded to the underlying conductive layer through a pad 5.

Close to resistive element ER1, a filtering network composed of high-impedance lines 6, 7 and 8 and sector resonators 9 and 10 is connected to line 4. This network communicates with pad 11 which allows the connection with the source bias current supply.

Gate 1 is also connected to a line 12, terminated in its characteristic impedance with a resistive element ER2, grounded through pad 13.

Finally, drain 3 is connected through three-step impedance transformer 14 to the output line 15, whereupon a coupled-line element 16 is placed to block dc current. A filtering network placed upstream of element 16, analogously to the one connected to the source, consists of lines 17, 18, 19, of sector resonators 20, 21 and of pad 22. The drain current generator is connected to this pad.

The start of oscillations is due to the positive feedback obtained by loading gate 1 and source 2 with suitable reactances.

More particularly, in the case of source 2, the desired reactance is produced by positioning in parallel to line 4 a microstrip resonator RS of the sector type, placed at a suitable distance from the source and with its axis orthogonal to line 4. It operates in first approximation as a microstrip line with variable width and length equal to $\lambda/4$, which transforms the open circuit at its end (in correspondence with the curved side) into a short-circuit at the vertex, which is in contact with line 4. The electrical length of the trunk comprised between source and sector RS is well-defined, thanks to the limit contact area between sector and line.

Source load reactance, required of the design, is obtained by duly dimensioning the above trunk length between source and RS.

The desired reactance on gate 1 is obtained by coupling a dielectric resonator RD to line 1 at a suitable distance from the gate. The same resonator also stabilizes the oscillation frequency. In a first approximation, an open circuit is realized at RD resonance frequency in the coupling section, i.e. in the section of line 1 identified by the axis crossing the resonator centre and orthogonal to the same line. By suitably dimensioning the distance of resonator from gate 1, the desired reactance is obtained.

Since resonator RS has a comparatively low quality factor Q, of the order of hundredths, and hence a comparatively wide band, the synchronism with resonator RD is easily attained and its adjustment, i.e. the accurate RD positioning, results is particularly simple. On the other hand, although the RS quality factor is comparatively low, the short-circuit produced on line 4 presents a very-low resistive component, since element RS is in electric contact with line 4. As a consequence the degree of positive feedback is about as high as possible and hence the efficiency in terms of output power is optimal.

Of course, all the advantages derived by the damping of possible undesired oscillations outside the working band are maintained. In fact these oscillations appear at frequencies considerably far from working frequency (generally at very low frequencies), for which the element RS is widely out of resonance and hence the source is loaded in a purely-resistive way through line 4 terminated by element ER1.

We claim:

1. In an integrated microwave oscillator wherein a first terminal of an active device is connected to a first microstrip line grounded by a resistive element having an impedance equal to the characteristic impedance of said first microstrip line, a dielectric resonator being coupled to said first line at a distance from the first terminal, a second terminal of the active device is connected to a second microstrip line grounded by another resistive element having an impedance equal to the characteristic impedance of said second microstrip line, and a third terminal of the active device is connected to an output through an impedance matching microstrip line, filtering networks for the passage of feeding and bias currents being connected to said terminals, the improvement wherein in parallel with the second line there is placed a microstrip resonator with a quality factor considerably lower than the quality factor of said dielectric resonator and with resonance frequency close to that of the dielectric resonator, the microstrip resonator location along the second line being chosen such as to obtain an impedance at the second terminal such that a high degree of positive feedback is obtained with simple synchronism adjustment of the microstrip resonator with a dielectric resonator.

2. The improvement defined in claim 1 wherein said microstrip resonator is a sector with the axis perpendicular to said second line, with the vertex placed in contact with the second line and with an equivalent electric length such as to generate at the frequency of the produced signal a short-circuit at the contact point.

* * * * *